United States Patent [19]

Matsui

[11] Patent Number: 5,343,200
[45] Date of Patent: Aug. 30, 1994

[54] ANALOG/DIGITAL CONVERTER WITH DIGITAL AUTOMATIC GAIN CONTROL

[75] Inventor: Hisayoshi Matsui, Kawasaki, Japan

[73] Assignee: Canon Kabushiki Kaisha, Tokyo, Japan

[21] Appl. No.: 82,512

[22] Filed: Jun. 25, 1993

Related U.S. Application Data

[63] Continuation of Ser. No. 974,339, Nov. 10, 1992, abandoned, which is a continuation of Ser. No. 753,056, Aug. 30, 1991, abandoned.

[30] Foreign Application Priority Data

Aug. 31, 1990 [JP] Japan .................................. 2-227971
Feb. 22, 1991 [JP] Japan .................................. 3-028224

[51] Int. Cl.$^5$ .............................................. H03M 1/18
[52] U.S. Cl. ........................................ 341/139; 341/159
[58] Field of Search ................ 341/139, 155, 156, 161

[56] References Cited

U.S. PATENT DOCUMENTS

| 4,625,240 | 11/1986 | Yablonski et al. | 358/143 |
| 4,851,842 | 7/1989 | Iwamatsu | 341/139 |
| 4,876,502 | 10/1989 | Verbanets et al. | 324/115 |
| 4,910,515 | 3/1990 | Iwamatsu | 341/110 |
| 4,990,913 | 2/1991 | Beauducel | 341/139 |

Primary Examiner—Marc S. Hoff
Attorney, Agent, or Firm—Fitzpatrick, Cella, Harper & Scinto

[57] ABSTRACT

Analog data which enters an analog/digital converter 401 is converted into corresponding digital data. The resulting digital data is outputted upon being shifted by a bit shifting circuit. The latter shifts the digital by a number of bits set in a bit-shift quantity setting register. As a result, automatic gain control can be performed by relying on simple processing without using an amplifier consisting of complicated analog circuitry. For example, by setting a "+1" bit in the bit-shift quantity setting register, the data resulting from the A/D conversion can be doubled. The data can be multiplied by eight if a "3" bit is set, and by ¼ if a "−2" bit is set.

18 Claims, 8 Drawing Sheets

ANALOG/DIGITAL CONVERTER WITH DIGITAL AUTOMATIC GAIN CONTROL

This application is a continuation of application Ser. No. 07/974,339 now abandoned filed Nov. 10, 1992, which is a continuation of application Ser. No. 07/753,056 now abandoned filed Aug. 30, 1991.

BACKGROUND OF THE INVENTION

This invention relates to an analog/digital converter and, more particularly, to an analog-digital converter ideal for applications where an AGC (Automatic Gain Control) circuit is realized by digital signal processing.

FIG. 1 illustrates an example in which an AGC circuit is constructed in a conventional digital signal processing unit in order to convert analog data into corresponding digital data.

The digital signal processing unit shown in FIG. 1 includes a variable-gain amplifier 101 for amplifying input analog data (an analog voltage) at a predetermined gain in accordance with control executed by a digital signal processor (hereinafter referred to as a "DSP") or microprocessor (hereinafter referred to as an "MPU") 103, an ordinary well-known analog/digital (hereinafter referred to as "A/D") converter 102, and the DSP or MPU 103.

The operation of an AGC circuit which includes the analog/digital converter in the conventional apparatus of this kind will be described.

First, the DSP or MPU 103 initializes (e.g., sets to "1") the gain of the variable-gain amplifier 101 and calculates the average value of the square of the output data from the A/D converter 102. If this value is less than the set value, control for raising the gain of the variable-gain amplifier 101 is performed and the average value of the square of the output data from the A/D converter 102 is calculated again. By repeating this operation, the average value of the square of the output data from the A/D converter 102 eventually becomes larger than the predetermined set value. When this occurs, the gain of the variable-gain amplifier 102 is fixed and AGC processing is performed in accordance with the processing executed by the DSP shown in FIG. 2.

In the operation of the circuit shown in FIG. 2, the average value of the square of the output signal is obtained by a squaring unit 205 and an averaging unit 206. The average value of the square and the set value are added by an adder 204. The constant of a multiplier 201 is controlled using a register 202 and an adder 203 in such a manner that the difference, namely the error, between the average value of the square and the set value becomes "0". Thus, the average value of the outputs attains a constant level.

If, in the digital signal processing unit described above, the number of bits corresponding to the dynamic range of the analog input voltage is greater than the number of bits corresponding to the operational precision of the DSP 103 that is necessary for signal processing, first the analog voltage is amplified to a level capable of being computed by the DSP 103 under coarse control performed by the variable-gain amplifier 101, and then AGC processing is performed under fine control based upon the processing of the DSP 103.

In general, the variable-gain amplifier 101 is capable of being set to any of a number of gains (e.g., $1\times, 2\times, 4\times, 8\times, \ldots$, etc.).

A disadvantage encountered in the prior art described above is that an analog circuit such as the variable-gain amplifier 101 is required. This is disadvantageous because the circuit has a complicated construction and its performance is influenced by the characteristics of the various elements that construct it.

Accordingly, in order to widen the dynamic range of the input voltage level, an arrangement should be adopted in which the variable-gain amplifier is eliminated, the precision of the A/D 102 is raised to increase the number of output bits and all AGC processing is performed in accordance with the processing executed by the DSP 103. The foregoing problems can be solved by adopting such an arrangement. Since an A/D converter having a large number of output bits has recently become available at low cost, adopting the above-described arrangement is considered to be effective.

However, if there is an increase in the number of output bits of the A/D converter 102, the number of operational bits of the DSP 103 also must be increased. In addition, even if the AGC processing shown in FIG. 2 is performed upon increasing the number of operational bits, the time needed for the gain to converge is prolonged greatly in a case where the dynamic range of the input data has been widened. This represents another problem.

In order to solve this latter problem, AGC of the kind shown in FIG. 3 can be adopted. However, when AGC processing of this type is realized by a DSP, an enormous amount of processing is required to be performed by a divider 301 and a square-root unit 302. As a consequence, the time required for processing is great and this arrangement does not offer a truly practical solution.

SUMMARY OF THE INVENTION

An object of the present invention is to provide an analog/digital converter in which AGC based upon simple processing is capable of being performed without using an amplifier composed of complicated analog circuitry, and in which signal processing is carried out using an inexpensive processor.

According to the present invention, the foregoing object is attained by providing an analog/digital converting unit for converting analog data into corresponding digital data, an output unit for bit-shifting and outputting the digital data resulting from the conversion performed by the analog/digital converting unit, and a control unit for externally controlling the amount of bit shift performed by the output unit.

In the arrangement described above, the A/D converter used in digital signal processing is provided with the function for shifting and outputting the digital data resulting from the conversion, and the function for externally setting the number of bits shifted. This makes it possible to reduce the circuitry and amount of processing required in the AGC of the overall system.

Another object of the present invention is to provide an analog/digital converter which comprises analog/digital converting means for converting an analog input voltage into corresponding digital data, detecting means for detecting a maximum value of analog input voltage, amplifying means for amplifying voltage in dependence upon the maximum value detected by the detecting means, and output means for shifting and outputting, to an external system, the digital data from the analog/digital converting means in dependence upon the degree of amplification of the voltage amplified by the amplifying means.

Still another object of the present invention is to provide an analog/digital converter capable of increasing the apparent number of output bits of digital data, which results from A/D conversion, without diminishing processing speed.

A further object of the present invention is to provide an analog/digital converter capable of reducing the burden on a DSP through simple AGC processing and in a short processing time.

Yet another object of the present invention is to provide an analog/digital converter for use in a digital AGC circuit, wherein the converter is capable of calculating the average value of absolute values of a certain number of items of data contained in A/D-converted input data, and of performing AGC processing under coarse control based on simple shift processing of data conforming to the calculated average value.

Other features and advantages of the present invention will be apparent from the following description taken in conjunction with the accompanying drawings, in which like reference characters designate the same or similar parts throughout the figures thereof.

DESCRIPTION OF THE PREFERRED EMBODIMENTS

Embodiments according to the present invention will now be described in detail with reference to the drawings.

FIRST EMBODIMENT

Figure 4:
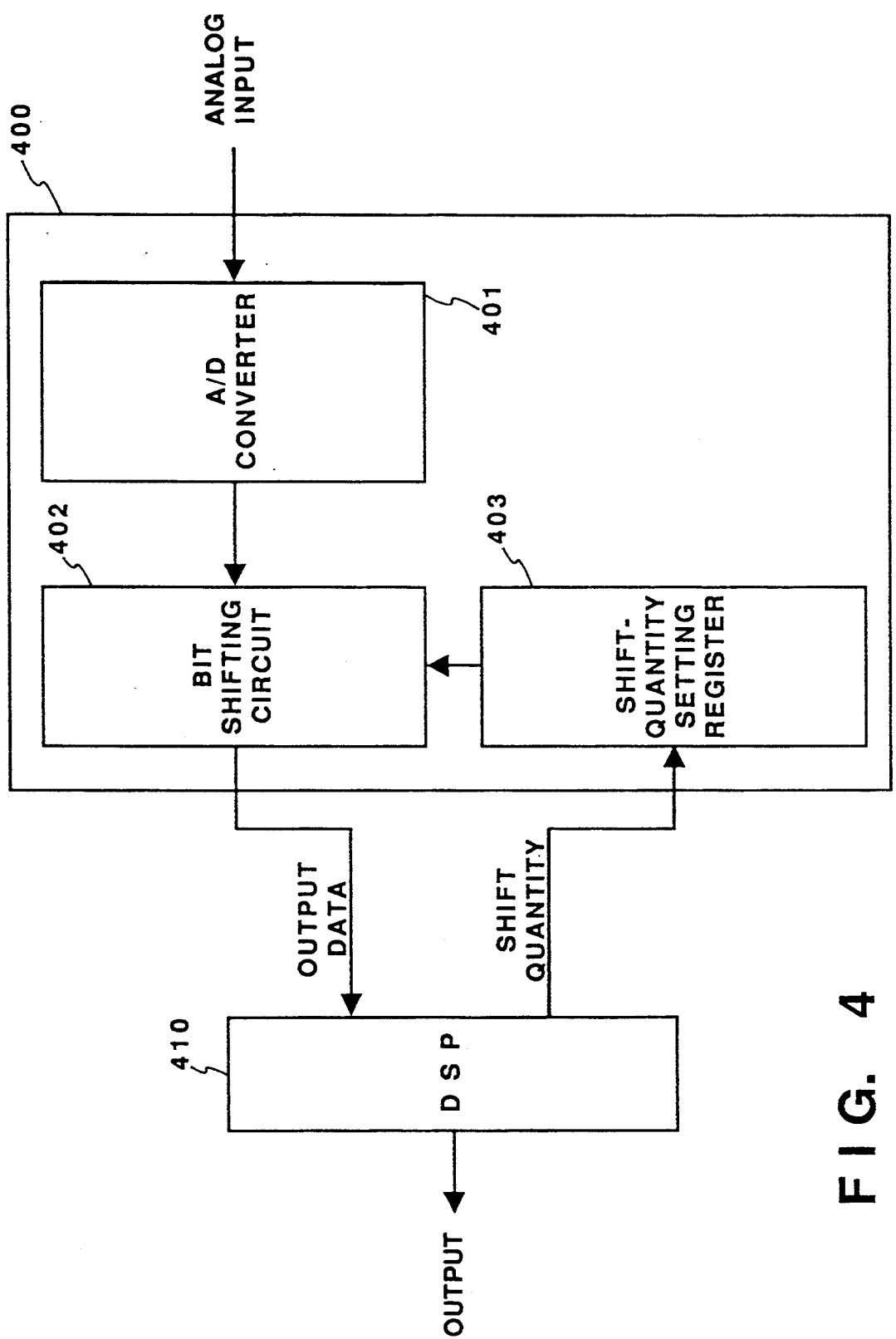
FIG. 4 is a block diagram illustrating a digital signal processing unit according to a first embodiment of the present invention.

FIG. 4 is a diagram which best shows the characterizing features of an A/D converting unit according to the first embodiment of the present invention. In FIG. 4, numeral 400 denotes an A/D converting unit, and 410 a DSP. It should be noted that the device connected to the A/D converting unit 400 in this embodiment is not limited to the DSP 410. A microprocessor can be connected to the A/D converting 400 if desired.

The A/D 400 includes an A/D converter 401 for converting an analog input voltage into corresponding digital data, a bit shifting circuit 402 for bit-shifting and outputting the digital data resulting from the conversion performed by the A/D converter 401, this output serving as the output of the A/D converting unit 400, and a register 403 for setting the shift quantity of the bit shifting circuit 402, the number of bits shifted being set from outside (from the DSP 410). The bit shifting circuit 402 outputs the input data from the A/D converter 401 upon performing a bit shift by an amount set in the shift-quantity setting register 403.

In the operation of the A/D converting unit 400 constructed as set forth above, if the number of bits desired to be shifted in the bit shifting circuit 402 is set in the shift-quantity setting register 403 from the outside (from the DSP 410), the bit shifting circuit 402 will output the A/D-converted data from the A/D converter 401 upon shifting this data by the set number of bits.

Figure 1:
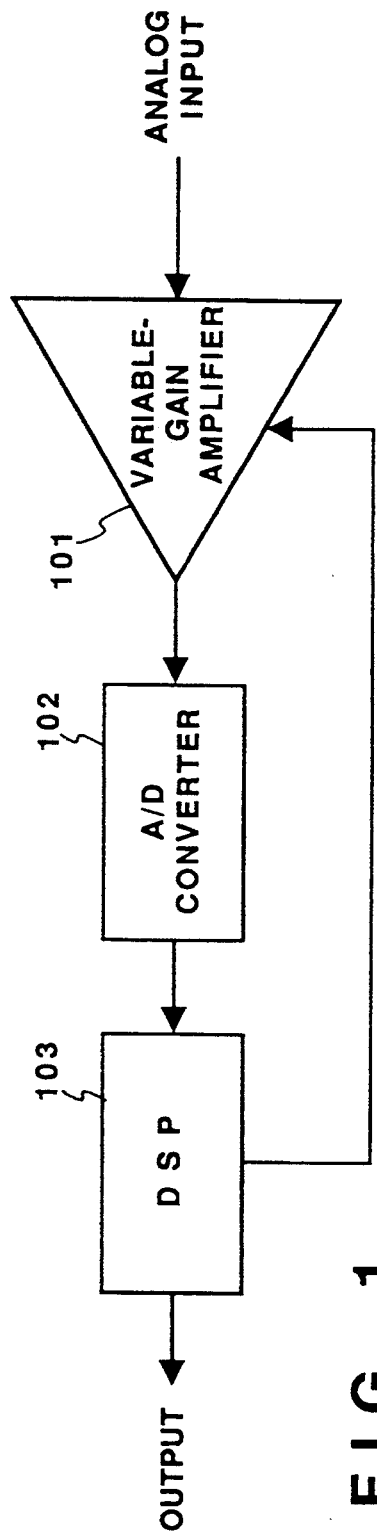
FIG. 1 is a block diagram illustrating a digital signal processing unit according to the prior art.

More specifically, whereas the DSP 103 of FIG. 1 controls the gain of the variable-gain amplifier 101, the DSP 410 in FIG. 4 controls the amount of shift performed by the bit shifting circuit 402.

For example, if the DSP 410 sets "+1" in the shift-quantity setting register 403, the input data to the bit shifting circuit 402 from the A/D converter 401 is outputted upon being shifted by one bit toward the MSB side. Similarly, if the DSP 410 sets "+3" in the shift-quantity setting register 403, the input data to the bit shifting circuit 402 from the A/D converter 401 is outputted upon being shifted by three bits toward the MSB side. In either case, "0" enters the portion of the bit shifted on the LSB side in the shifting circuit 402.

If "−2" has been set in the shift-quantity setting register 403, the input data to the bit shifting circuit 402 is outputted upon being shifted by two bits toward the LSB side. At this time, "0"s enter the two bits on the MSB side.

AS a result of these operations, it is possible to output the A/D-converted data upon multiplying it by two (+1 bit), by eight (+3 bits) and by one quarter (−2 bits).

Thus, if the A/D converting unit of the present embodiment is employed, AGC control of the DSP 410 can be carried out digitally. Moreover, variable control of the outputted digital quantity can be performed by the A/D converting unit 400.

Therefore, in accordance with this embodiment, an operation equivalent to that of the digital signal processing unit having the construction of FIG. 1 can be realized by relying upon the DSP 410 and A/D converting unit 400.

More specifically, in the present embodiment, control of the gain of the variable-gain amplifier 101 shown in FIG. 1 is capable of being performed merely by controlling the amount of shift with regard to the output of the A/D converter, as shown in FIG. 4.

Figure 2:
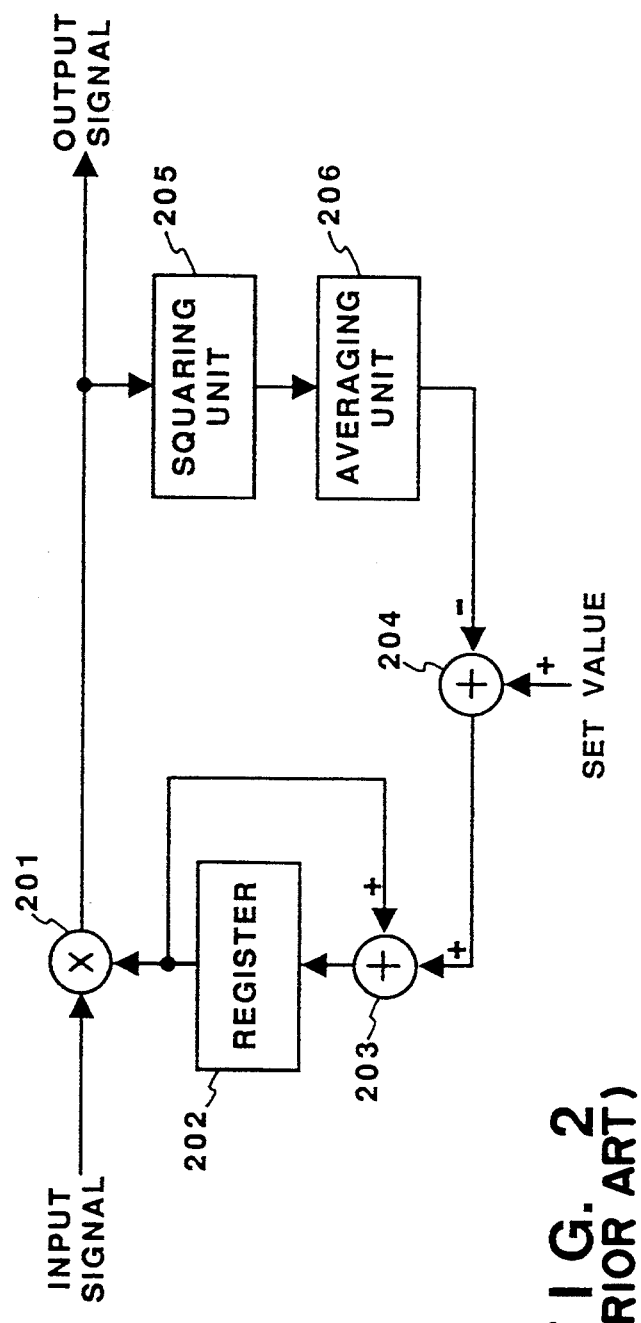
FIG. 2 is a block diagram for describing processing executed by a DSP according to the prior art.
Figure 3:
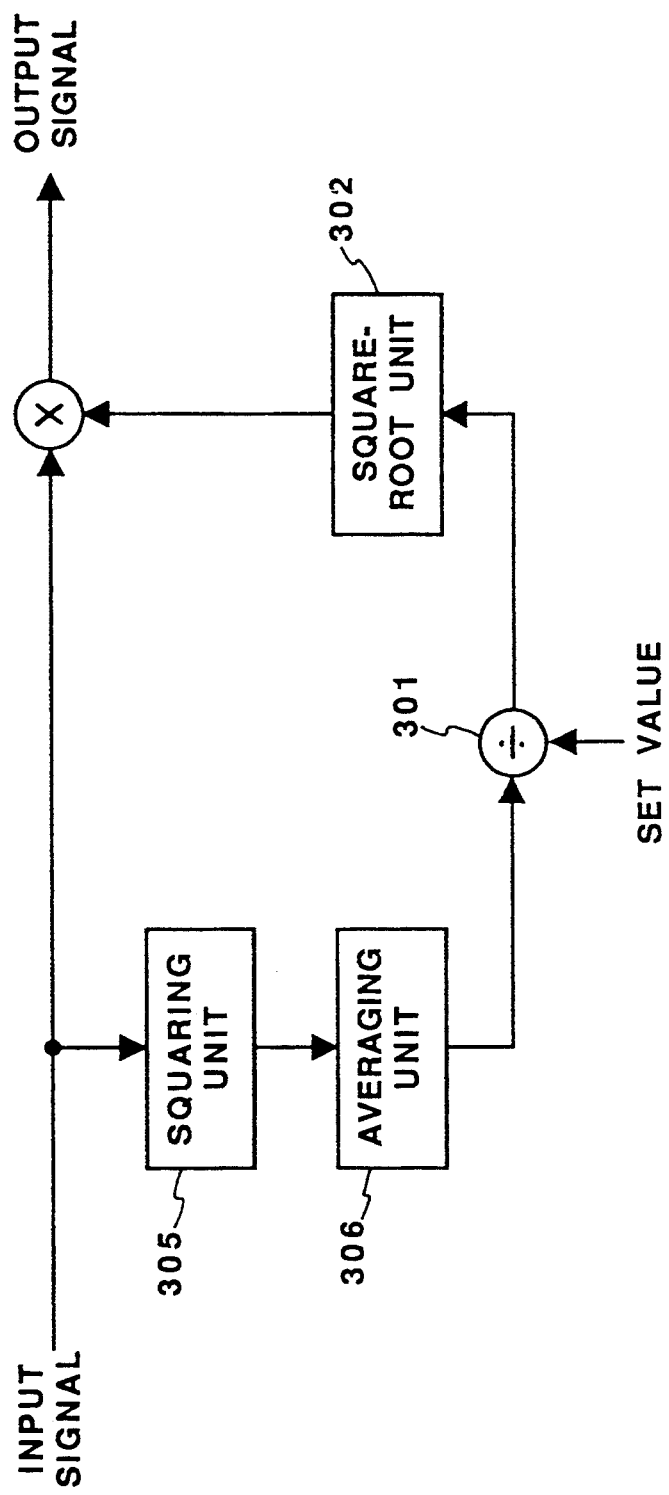
FIG. 3 is a block diagram for describing processing executed by a DSP according to another example of the prior art.

First, the DSP 410 initializes (e.g., sets to "1") the shift-quantity of the shift-quantity setting register 403 and calculates the average value of the square of the output data from the bit shifting circuit 402. If this value is less than the set value, the DSP 410 controls for raising the shift-quantity of the shift-quantity setting register 403 and calculates the average value of the square of the output data from the bit shifting circuit 402 again. By repeating this operation, the average value of the square of the output data from the bit shifting circuit 402 eventually becomes larger than the predetermined set value. When this occurs, the shift-quantity of the shift-quantity setting register 403 is fixed and detailed AGC processing is performed in accordance with the processing executed by the DSP 410 in FIG. 2.

As a result of the foregoing, it is no longer necessary to provide the circuitry of the portion corresponding to the variable-gain amplifier for the analog voltage, unlike the prior art.

As described above, a digital signal processing unit is constructed using an A/D converter having a simple bit-shift control circuit. As a result, outstanding actions and effects can be obtained, namely the fact that AGC implemented by simple processing is capable of being performed without using an amplifier composed of complicated analog circuitry.

In addition, since AGC relying upon simple processing is possible without using an amplifier composed of complicated analog circuitry, signal processing can be carried out using a less costly processor.

SECOND EMBODIMENT

Figure 5:
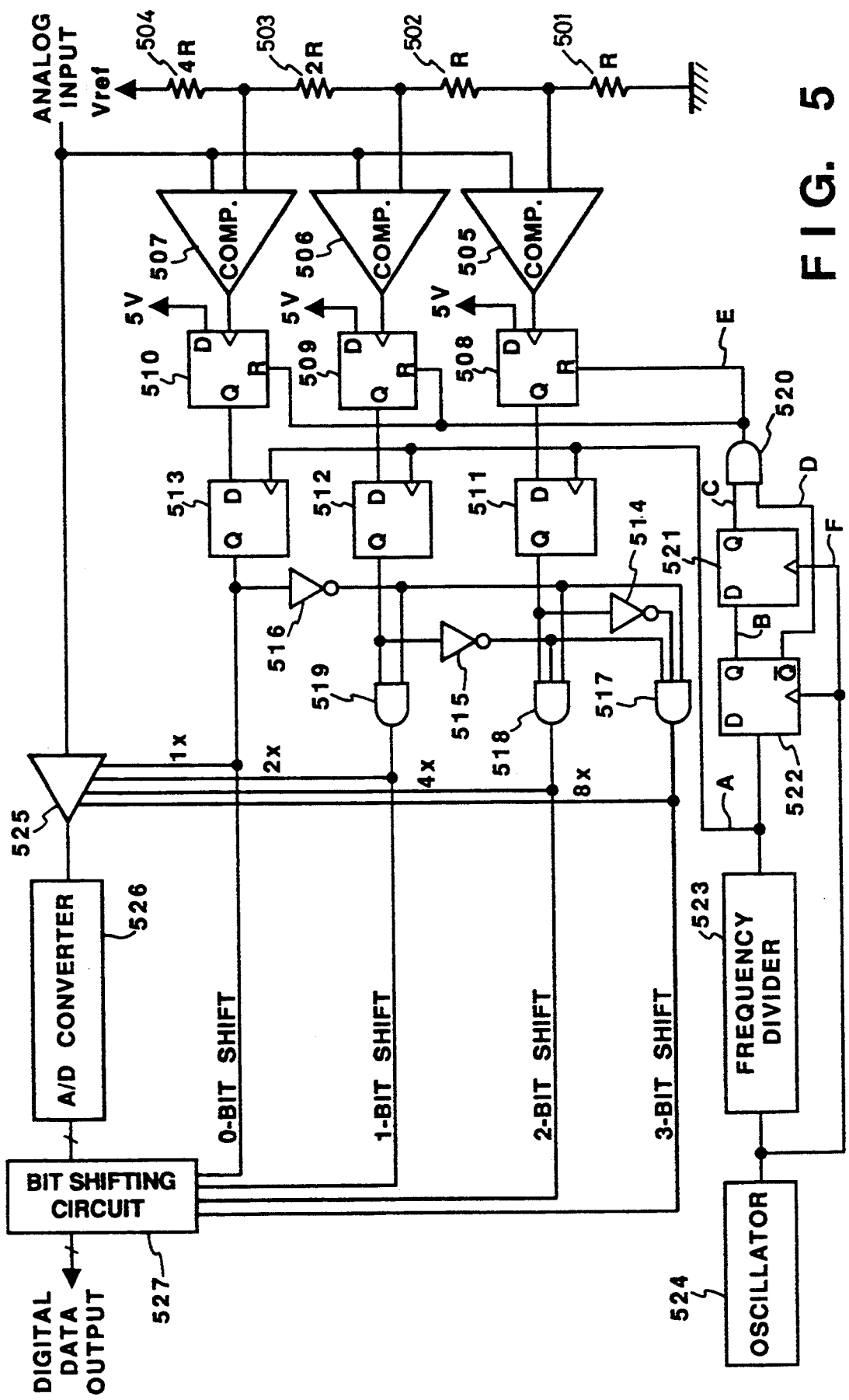
FIG. 5 is a block diagram illustrating the construction of a second embodiment according to the present invention.

FIG. 5 is a diagram illustrating the construction of a second embodiment according to the present invention.

The circuitry shown in FIG. 5 includes resistors 501, 502 having equal resistance values, a resistor 503 having a resistance value twice that of resistor 501, and a resistor 504 having a resistance value four times that of resistor 501. One end of resistor 504 is connected to a maximum voltage Vref capable of being A/D-converted by an A/D converter 526. Also included in the circuitry are comparators 505, 506 and 507, flip-flops (hereinafter referred to as "FF"s) 508–513, 521 and 522, inverters 514–516, AND gates 517–520, a frequency-divider circuit 523, an oscillator 524 for generating a reference clock, a variable-gain amplifier 525, an A/D converter 526 for converting analog data into the corresponding digital data, and a bit shifting circuit 527.

The analog input voltage to be A/D-converted enters the variable-gain amplifier 525 as well as one input terminal of each of the comparators 505, 506 and 507. Since one end of the resistor 504 is connected to the maximum voltage Vref capable of being A/D-converted, ½ Vref, ¼ Vref and ⅛ Vref enter the other input terminal of comparators 507, 506 and 505, respectively. When the analog input voltage exceeds ½ Vref, the outputs of the comparators 507, 506 and 505 all rise.

If the analog input voltage is greater than ¼ Vref and less than ½ Vref, the outputs of comparators 505 and 506 rise but the output of the comparator 507 does not. If the analog input voltage is greater than ⅛ Vref and less than ¼ Vref, the output solely of comparator 505 rises and the outputs of the comparators 506, 507 do not. If the peak value of the analog input voltage is less than ⅛ Vref, none of the outputs of the comparators rise. The outputs of the comparators 505, 506 and 507 are connected to the clock terminals of respective FFs 508, 509 and 510. The D terminals of the FFs 508–510 are all set to the high level. As a consequence, the FFs 508–510 are set by the leading edges of the outputs from the comparators 505–507, respectively.

Figure 6:
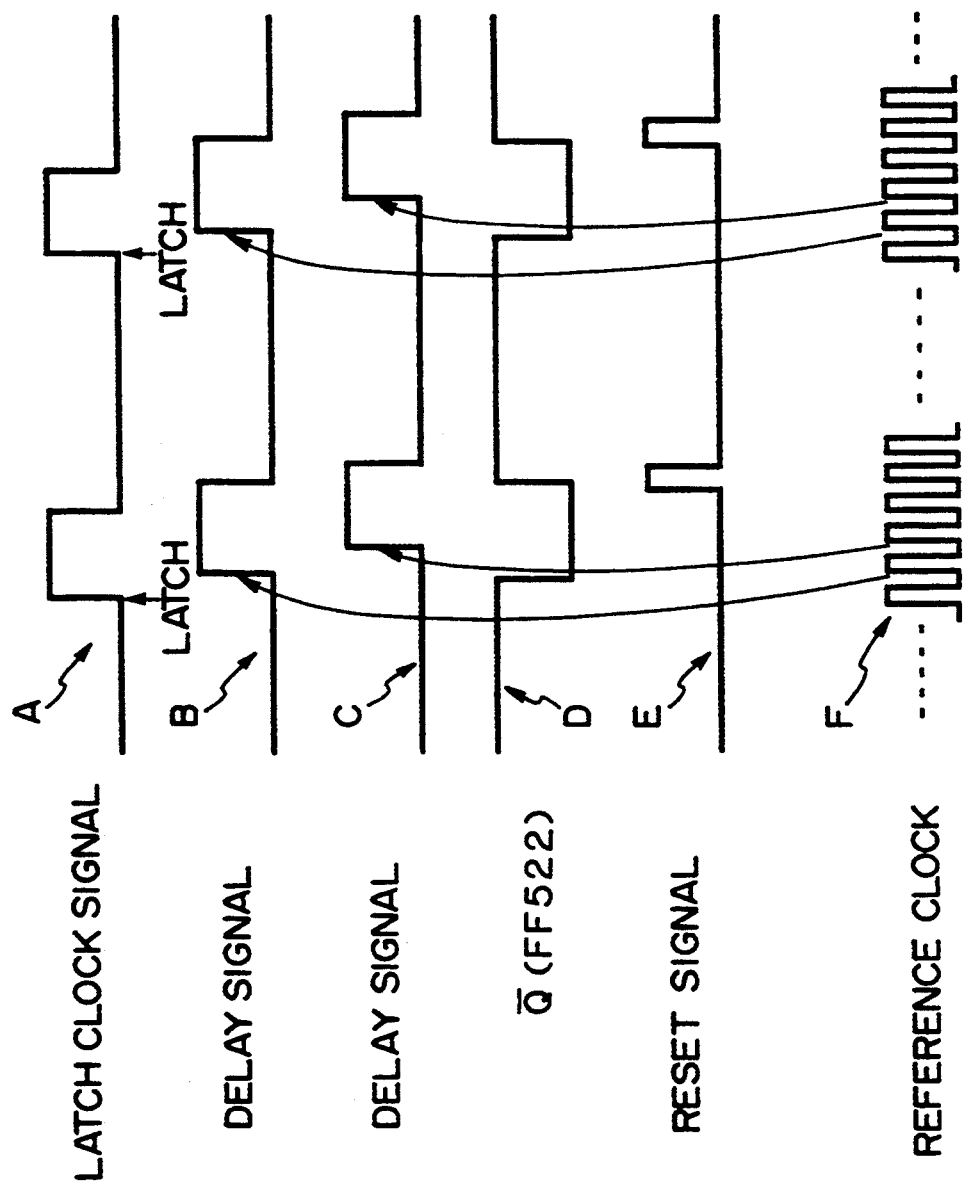
FIG. 6 is a timing chart associated with a latch circuit of the embodiment shown in FIG. 5.

The oscillator 524 constantly generates a reference clock shown at F in FIG. 6. The reference clock is frequency-divided by the frequency-divider circuit 523 so that a latch clock signal for the FFs 511–513 is produced as shown at A in FIG. 6. The latch clock signal is supplied to the D terminal of FF 522, whereby the FF 522 outputs a signal, shown at B in FIG. 6, that lags one reference clock pulse behind the latch clock signal. Furthermore, the output signal from the FF 522 is supplied to the D terminal of the FF 521, whereby the FF 521 Outputs a signal, shown at C in FIG. 6, that lags one reference clock pulse behind the output signal from FF 522 (two reference clock pulses behind the latch clock signal). The $\overline{Q}$ output from the FF 522 as shown at D in FIG. 6 and the Q output from the FF 521 enter the AND gate 520, the output whereof constitutes a reset signal for the FFs 508–510. The reset signal, which is shown at E in FIG. 6, has a pulse width equivalent to one clock of the reference clock pulse.

As a result, after the FFs 508–510 have been reset by the leading edge of the reset signal E, they attain the set state when the leading edges of the outputs from the comparators 505–507 arrive before the latch clock A rises. Thereafter, when the latch clock signal A, which is the output of the frequency divider 523, rises, the states of the FFs 505–507 are latched in the FFs 511–513, respectively.

The outputs of the FFs 511–513 are connected to the respective inverters 514–516 and respective AND gates 517–519 to be converted into bit-shift designating signals for the bit shifting circuit 527 and amplification designating signals for the variable-gain amplifier 525.

More specifically, if the FFs 511–513 have been set, the AND gates 517–519 are disabled so that a 0 bit-shift designating signal is delivered to the bit shifting circuit 527 and a "1×" amplification designating signal to the variable-gain amplifier 525. When only FFs 511 and 512 have been set, the AND gate 519 is enabled so that a 1 bit-shift designating signal is delivered to the bit shifting circuit 527 and a "2×" (twofold) amplification designating signal to the variable-gain amplifier 525. When only the FF 511 has been set, the AND gate 518 is enabled so that a 2 bit-shift designating signal is delivered to the bit shifting circuit 527 and a "4×" (fourfold) amplification designating signal to the variable-gain amplifier 525. When none of the FFs 511–513 has been set, the AND gate 517 is enabled so that a 3 bit-shift designating signal is delivered to the bit shifting circuit 527 and an "8×" (eightfold) amplification designating signal to the variable-gain amplifier 525.

It is assumed that the output of the frequency divider 523 is such that the time from the leading edge of the reset signal E to the leading edge of the latch clock signal A is suitably selected to be several times to several hundred times the conversion period of the A/D converter.

The operation of the embodiment constructed as set forth above will now be described.

If the maximum value of the analog input voltage to be A/D-converted exceeds ½ Vref in the interval from the leading edge of the reset signal E to the leading edge of the latch clock signal A in FIG. 6, all of the outputs of comparators 507, 506, 505 rise, all of the FFs 508–510 are set, and all of the FFs 511–513 are set at this time. As a result, the gain input of the variable-gain amplifier 525 is 1×, the output of the variable-gain amplifier 525 remains at the analog input voltage, this value is A/D-converted and the resulting digital value is inputted to the bit shifting circuit 527.

The shift input of the bit shifting circuit 527 is only a 0 bit-shift input corresponding to the gain input 1 of the variable-gain amplifier 525, and therefore the output of the A/D amplifier 526 is delivered intact to the outside as digital data.

If the maximum value of the analog input voltage to be A/D-converted is less than ½ Vref but exceeds ¼ Vref in the interval from the leading edge of the reset signal E to the leading edge of the latch clock signal A in FIG.

6, the outputs of comparators 505, 506 rise, the FFs 508, 509 are set, and the FFs 511, 512 are set at this time. As a result, the gain input of the variable-gain amplifier 525 becomes 2×, the output of the variable-gain amplifier 525 becomes double the analog input voltage, this value is A/D-converted and the resulting digital value is inputted to the bit shifting circuit 527.

The shift input of the bit shifting circuit 527 is only a 1 bit-shift input, and therefore the output of the A/D amplifier 526 is delivered to the outside as digital data upon being shifted by one bit to the LSB side.

Similarly, if the maximum value of the analog input voltage to be A/D-converted is greater than $\frac{1}{8}$ Vref and less than $\frac{1}{4}$ Vref in the interval from the leading edge of the reset signal E to the leading edge of the latch clock signal A in FIG. 6, solely the output of comparator 505 rises, the output of FF 508 attains the high level, and the FF 511 is set at this time. As a result, the gain input of the variable-gain amplifier 525 becomes 4.·., the output of the variable-gain amplifier 525 becomes four times the analog input voltage, this value is A/D-converted and the resulting digital value is inputted to the bit shifting circuit 527.

The shift input of the bit shifting circuit 527 is only a 2 bit-shift input, and therefore the output of the A/D amplifier 526 is delivered to the outside as digital data upon being shifted by two bits to the MSB side.

Further, if the peak value of the analog input voltage to be A/D-converted is less than $\frac{1}{8}$ Vref in the interval from the leading edge of the reset signal E to the leading edge of the latch clock signal A in FIG. 6, the gain input of the variable-gain amplifier 525 becomes 8×, and therefore the bit shifting circuit shifts the A/D-converted digital data three bits to the MSB side before outputting this data.

By virtue of this arrangement, the analog voltage which enters the A/D converter is scaled optimally at all times, the accuracy of the outputs bits is maintained and the number of bits in the output digital data can be enlarged.

It should be noted that the code bits enter as is on the MSB side shifted by the bit shifting circuit.

The present invention is not limited to the example described above. For example, by increasing the circuitry of the peak detecting section, the number of bits can be increased at will.

Figure 7:
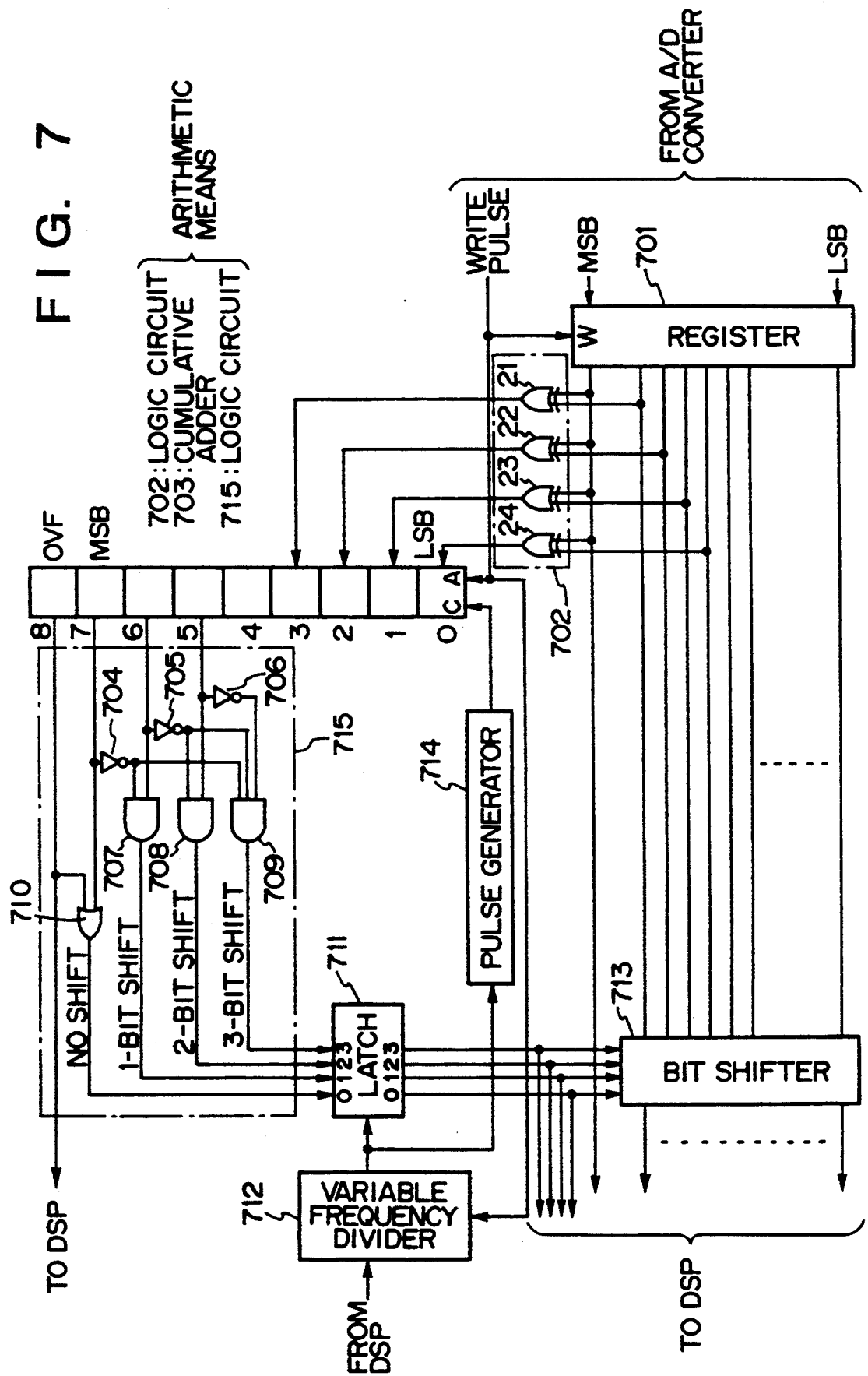
FIG. 7 is a circuit diagram showing a third embodiment of the present invention.

FIG. 7 is a circuit diagram showing the construction of a digital AGC circuit according to the third embodiment. In FIG. 7, numeral 701 denotes a register for temporarily storing the input data converted into a digital signal. The output data from the A/D converter is written in the register 701 in the form of a two's-complement, by way of example. With the exception of the MSB, the output bits of the register 701 are connected to the respective bits on the input side of a bit shifter 713. The MSB on the output side of the register 701 is connected to one input terminal of each of exclusive-OR gates 21–24 and to the MSB on the input side of the data input unit of the DSP. The four bits following the MSB on the output side of the register 701 are connected to the other input terminal of each of the exclusive-OR gates 21–24, respectively. The outputs of the exclusive-OR gates 21–24 enter the respective 3rd through 0th (LSB) bits of a cumulative adder 703. The 7th bit on the output side of the cumulative adder 703 is connected to one input terminal of an OR gate 710 and to the input side of an inverter 704. The 8th bit on the output side of the cumulative adder 703 is connected to the input side of the DSP and to the other input terminal of the OR gate 710. The 6th bit on the output side of the cumulative adder 703 is connected to one input terminal of an AND gate 707 and to the input side of an inverter 705. The 5th bit on the output side of the cumulative adder 703 is connected to one input terminal of an AND gate 708 and to the input side of an inverter 706. The output side of the OR gate 710 is connected to the 0th bit input side on the of a latch 711, the 1st bit of the latch 711 on its input side is connected to the output side of the AND gate 707, the 2nd bit of the latch 711 on its input side is connected to the output side of the AND gate 708, and the 3rd bit of the latch 711 on its input side is connected to the output side of the AND gate 709. The four bits output from the latch 711 is connected to the shift-quantity control input of the bit shifter 713 and, at the same time, to the input side of the DSP. The output side of the bit shifter 713 is connected to the input side of the DSP. A data-write pulse from the A/D converter 401 enters the register 701 from an input port (W) for the data-write pulse, and enters the cumulative adder 703 from an input port (A) for an adding pulse. The data-write pulse is inputted also to a clock input port of a variable frequency divider 712. The frequency-dividing ratio of the variable frequency divider 712 is set by the data output of the DSP, which is inputted to the frequency divider. The output of the frequency divider 712 enters the latch 711 as a latch pulse and is inputted also to a pulse generator 714. The output of the pulse generator 714 is connected to a clear input port (C) of the cumulative adder. A logic circuit 702 comprising the gates 21–24, the cumulative adder 703, and a logic circuit 715 comprising the inverters 704–706 and the gates 707–710 construct arithmetic means for calculating the average value of absolute values possessed by data composed of a set number of samplings from the input data stored in the register 701. The bit shifter 713 acts as shifting means for outputting the data, which has been stored in the register 701, upon shifting this data in dependence upon the calculated average value.

In the circuit constructed as set forth above, first the frequency dividing ratio of the variable frequency divider 712 is set (to 32, for example) by the DSP. Next, at the leading edge of the data-write pulse from the A/D converter 401, the A/D-converted data represented by the two's-complement is written in the register 701. The four-bit data following the MSB of this data is inverted by the logic circuit 702 when the MSB of the register 701 is 1, namely when the A/D-converted data is a negative number. When the A/D-converted data is a positive number, the aforementioned four-bit data enters the cumulative adder 703 intact. In other words, the absolute value of the high-order bit of the output data from the register 701 is obtained. This value is added to the data in the cumulative adder 703 at the leading edge of the write pulse. This adding operation is repeated a number of times set in the variable frequency divider 712. If the contents of the 8th through 0th bits of the cumulative adder 703 are, say, "001111111" as a result of the cumulative addition, only the output of AND gate 707 becomes logical "1"; the outputs of OR gate 710 and AND gates 708, 709 become logical "0". If the 7th and 8th bits of the results of addition performed by the cumulative adder 703 become logical "1", then only the output of the OR gate 710 rises to logical "1" and the outputs of AND gates 707, 708 and 709 go to logical "0". In other words, in accordance with the magnitude of the results of addition performed by the cumulative adder 703, only one of the outputs from the gates 707, 708, 709, 710 goes to logical "1". The values of these four bits are latched in the latch 711 when the cumulative addition has been performed the number of times set in the variable frequency divider 712. Thereafter, a clear pulse is generated by the pulse generator 714 to clear the contents of cumulative adder 703 to zero, after which addition starts again. Thus, operation is such that an average value of 32 cycles of the data inputted from the A/D converter 401 is calculated and one bit from among the output bits of the latch 711 becomes logical "1" in dependence upon the average value. Then, in dependence upon the bit that has gone to logical "1", the bit shifter 713 shifts the data of register 701 to the MSB side and then outputs the result to the DSP. In accordance with this embodiment, the operation is such that no shift is performed when the 0th bit of latch 711 is "1"; a one-bit shift is performed when the 1st bit of latch 711 is "1"; a two-bit shift is performed when the 2nd bit of latch 711 is "1"; and a three-bit shift is performed when the 3rd bit of latch 711 is "1".

By employing the circuit of FIG. 7, as described above, gains of 1×, 2×, 4× and 8× can be obtained with regard to A/D-converted digital data, without using large-scale circuitry such as a multiplier, in dependence upon the average value of absolute values possessed by data composed of a set number of samplings from the digital data.

Figure 8:
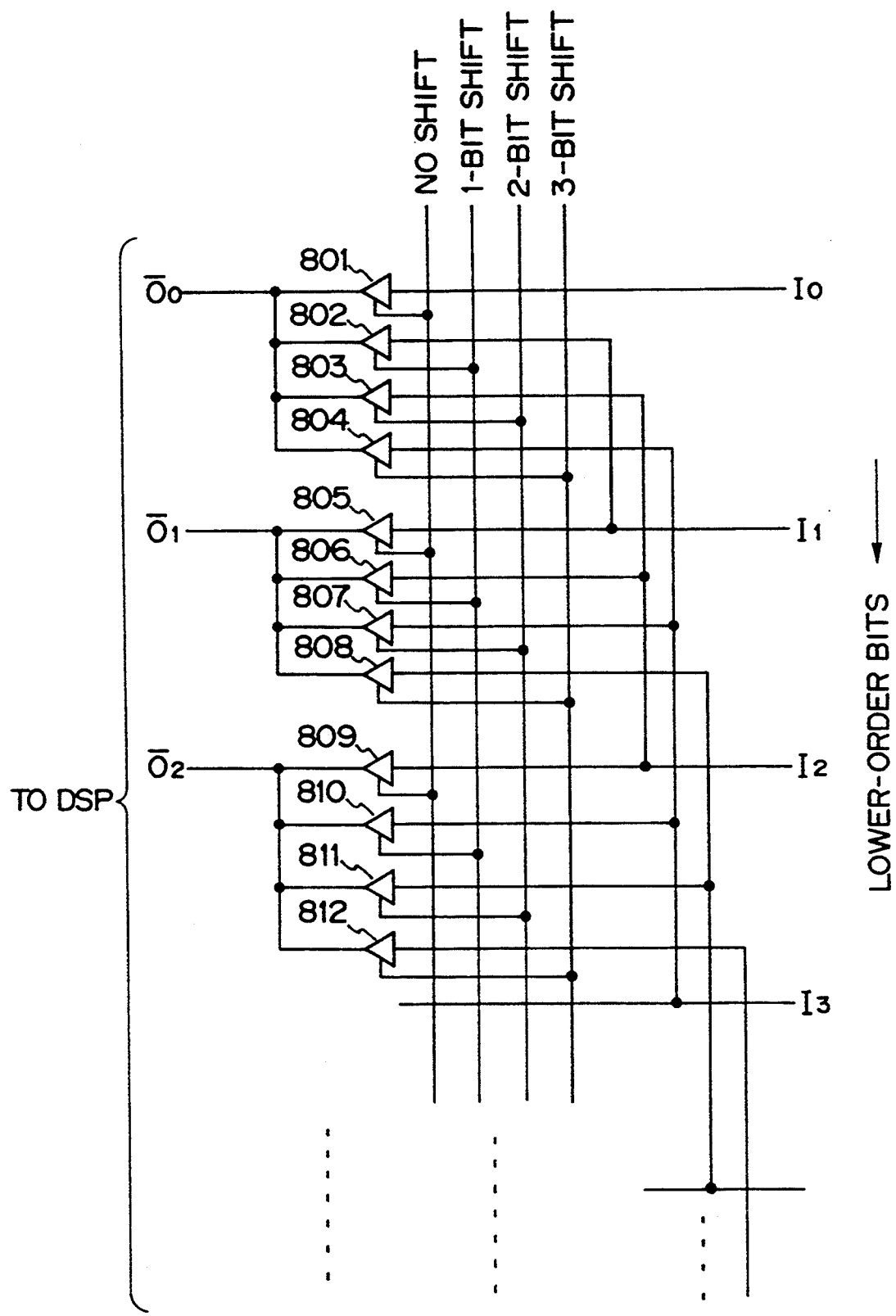
FIG. 8 is a diagram showing an example of a bit shifter illustrated in FIG. 7.

FIG. 8 illustrates an example of the construction of the bit shifter 713. Each of the bit shifting circuit 402 in FIG. 4 and the bit shifting circuit 527 have the same constitution as the bit shifting circuit 713 has. The operation regarding a $O_0$ output will be described first. In FIG. 8, 801 through 804 denote tri-state output buffers, the outputs of which are all supplied to a $O_0$ bit on the output side. An $I_0$ bit on the input side enters the buffer 801, and an $I_1$ bit that is one bit lower in order than the $I_0$ bit enters the buffer 802. An 12 bit that is two bits lower in order than the $I_2$ bit enters the buffer 803, and an 13 bit that is three bits lower in order than the $I_0$ bit enters the buffer 804. Unshifted data enters a control input terminal of the buffer 801, and one-bit shift data, two-bit shift data and three-bit shift data enters control input terminals of the buffers 802, 803 and 804, respectively. The wiring and connections of these inputs and outputs is performed similarly for each and every bit, as illustrated. If the signals are applied in such a manner that any one of the four shift-control signals in this circuit becomes logical "1" and the others logical "0", the input data can be outputted upon being shifted by the corresponding number of bits among bits 0, 1, 2 and 3. The circuitry need not be made large in scale.

Figure 9:
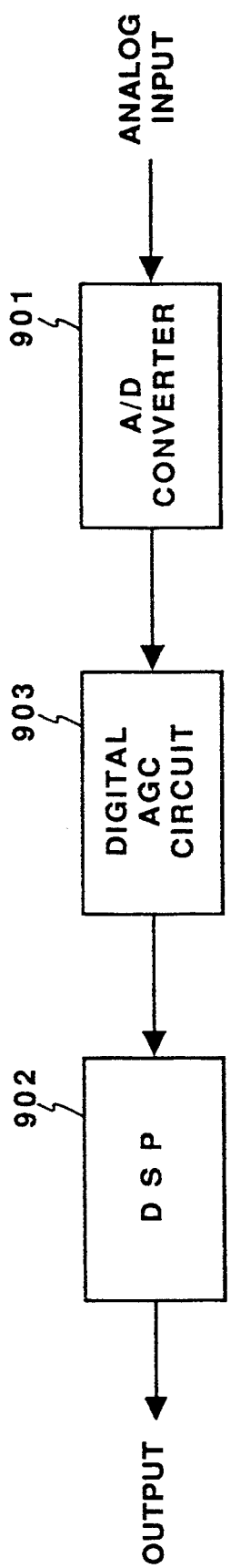
FIG. 9 is a block diagram showing the construction of a digital signal processing unit having the circuit of FIG. 7.

FIG. 9 is a block diagram illustrating the construction of a digital signal processing system equipped with AGC circuit shown in FIG. 7. Here a digital AGC circuit 903 shown in FIG. 7 is interposed between an A/D converter 901 and a DSP 902.

In a case where the DSP 902 uses the digital AGC circuit 903 according to this embodiment, data subjected to digital AGC processing by coarse control can be obtained by setting the frequency dividing ratio of the variable frequency divider 712 shown in FIG. 7. This makes it possible for gain to converge at high speed through a simple method requiring only a small amount of calculation in the AGC processing which carries out fine control by the DSP 902. As a result, the burden on the DSP 902 is reduced as well.

In a case where it is desired that the DSP 902 measure the actual value of input data, it will suffice to read in the four output bits, i.e., the shift control bits, of the latch 711 shown in FIG. 7, and subject the output of the bit shifter 713 to a reverse shift.

Though the bits which add the absolute values are the four bits following the MSB, any number of bits may be used.

In addition, the number of bits of the cumulative adder 703 may be freely selected in dependence upon the number of samplings for which averaging is desired and the value of the input data.

Furthermore, the number of bits of the circuit which decides the amount of shift may be changed in dependence upon the amount of shift desired. Shift control may be changed every two bits or more, not every bit. This can readily be realized if the circuit of FIG. 8 is modified.

As many apparently widely different embodiments of the present invention can be made without departing from the spirit and scope thereof, it is to be understood that the invention is not limited to the specific embodiments thereof except as defined in the appended claims.

What is claimed is:

1. An analog/digital converter comprising:
   a register for temporarily storing a digital data converted by an analog/digital converter;
   arithmetic means for calculating an average value of absolute values of a set number of samplings from the digital data stored in said register; and
   shifting means for shifting the data, which has been stored in said register, in dependence upon the average value calculated by said arithmetic means,
   wherein said arithmetic means comprises output means for outputting the digital data stored in said register or an inverted data based on the digital data stored in said register in accordance with sign bits in said register, and adding means for adding the output of said output means, and
   wherein said shifting means shifts the digital data in dependence upon an output of said adding means.

2. The analog/digital converter according to claim 1, wherein said arithmetic means calculates the average value of each absolute value of four lower-order bits of the digital data.

3. The analog/digital converter according to claim 1, wherein said arithmetic means calculates the average value of 32 cycles of the digital data.

4. The analog/digital converter according to claim 1, wherein said arithmetic means includes adder means for adding absolute values of some bits following an MSB bit of digital data composed of a plurality of bits over a set number of samplings from the digital data,
   wherein said shifting means shifts the data in dependence upon an output of said adder means.

5. An analog/digital converter comprising:
   detecting means for detecting a maximum value of analog input voltage;
   amplifying means for amplifying the analog input voltage in dependence upon the maximum value detected by said detecting means;
   analog/digital converting means for converting the analog input voltage amplified by said amplifying means into corresponding digital data;
   shifting means for bit-shifting the digital data, converted by said analog/digital converting means, in dependence upon the degree of amplification of the analog input voltage amplified by said amplifying means; and reset means for resetting the maximum value detected by said detecting means at a predetermined interval.

6. The analog/digital converter according to claim 5, wherein said detecting means detects whether the maximum value of the analog input voltage is greater than $\frac{1}{2}$, $\frac{1}{4}$ or $\frac{1}{8}$ of a maximum voltage value capable of being converted by sad analog/digital converting means.

7. The analog/digital converter according to claim 6, wherein said amplifying means amplifies voltage by a factor of one, a factor of two or a factor of four if the voltage detected by said detecting means is greater than $\frac{1}{2}$, less than $\frac{1}{2}$ but greater than $\frac{1}{4}$, or less than $\frac{1}{4}$ but greater than $\frac{1}{8}$, respectively, of the maximum voltage value capable of being converted by said analog/digital converting means.

8. The analog/digital converter according to claim 7, wherein shifting means outputs the digital data without performing a bit shift if said amplifying means has an amplification factor of one, and outputs the digital data upon performing a one-bit shift, a two-bit shift or a four-bit shift toward an LSB side if said amplifying means has an amplification factor of two, four or eight, respectively.

9. The analog/digital converter according to claim 5, wherein said detecting means comprises a first comparator for comparing the analog input voltage with a predetermined voltage, said amplifying means amplifies the analog input voltage by a factor of one or a factor of two if the analog input voltage exceeds the predetermined voltage or is less than the predetermined voltage, respectively, and said shifting means performs a one-bit shift toward an LSB side.

10. The analog/digital converter according to claim 9, wherein said detecting means comprises latch means for latching an output of said first comparator; and wherein said reset means resets said latch means at the predetermined interval.

11. The analog/digital converter according to claim 9, wherein said detecting means comprises a second comparator for comparing the analog input voltage with $\frac{1}{2}$ of the predetermined voltage, said amplifying means amplifies voltage by a factor of one or a factor of four if the analog input voltage exceeds the predetermined voltage or is less than $\frac{1}{2}$ of the predetermined voltage, respectively, and said shifting means performs a two-bit shift toward an LSB side.

12. The analog/digital converter according to claim 11, wherein said detecting means comprises first latch means for latching an output of said first comparator and second latch means for latching an output of said second comparator; and wherein said reset means resets said first and second latch means at the predetermined interval.

13. An analog/digital converter comprising:

input means for inputting a plurality of data that are composed of a plurality of bits respectively;

summing means for summing some bits of an MSB side of each of the plurality of data input by said input means; and shifting means for shifting each of the plurality of data input by said means in dependence upon an output of said summing means, wherein said summing means includes output means for outputting the some bits of data, in which the some bits are inverted corresponding to the MSB, and sums the output of said output means over the plurality of data.

14. The analog/digital converter according to claim 13, wherein said summing means sums some bits of the MSB side of first input data with some bits of the MSB side of second input data, and sums a resultant sum with some bits of the MSB side of third input data.

15. The analog/digital converter according to claim 13, wherein said input means includes storage means for storing a plurality of data b turns; and said summing means includes a cumulative adder for inputting data in parallel from a storage position of some bits of the MSB side of said storage means;

said cumulative adder adding a cumulative addition result and the stored data at the time of performing storing in said storage means.

16. A gain control method comprising the steps of:

inputting a plurality of data, each of which is composed of a plurality of bits including a sign bit;

inverting some bits of the data according to the sign bit;

summing the some bits of the plurality of data which are inverted according to the sign bit; and shifting each of the plurality of data according to the summing result by the summing step.

17. The gain control method according to claim 16, wherein the some bits of the data are bits of the sign bit side.

18. The gain control method according to claim 16, further comprising determining step for determining a shift amount used for the shifting step according to the summing result by the summing step.

* * * * *

UNITED STATES PATENT AND TRADEMARK OFFICE
CERTIFICATE OF CORRECTION

PATENT NO. : 5,343,200
DATED : August 30, 1994
INVENTOR(S) : HISAYOSHI MATSUI

It is certified that error appears in the above-identified patent and that said Letters Patent is hereby corrected as shown below:

ON TITLE PAGE

In [57] ABSTRACT, line 4: "digital" should read --digital data--.

COLUMN 1

Line 42, "amplifier 102" should read --amplifier 101--.

COLUMN 2

Line 10, "A/D 102" should read --A/D converter 102--.

COLUMN 4

Line 36, "AS" should read --As--.

COLUMN 6

Line 1, "Outputs" should read --outputs--.
Line 9, "clock of" should read --clock pulse of-- and "clock pulse." should read --clock.--.

COLUMN 7

Line 19, "4∴," should read --4x,--.

COLUMN 8

Line 9, "input side on the" should read --on the input side--.

UNITED STATES PATENT AND TRADEMARK OFFICE
CERTIFICATE OF CORRECTION

PATENT NO. : 5,343,200
DATED : August 30, 1994
INVENTOR(S) : HISAYOSHI MATSUI

It is certified that error appears in the above-identified patent and that said Letters Patent is hereby corrected as shown below:

COLUMN 9

Line 39, "12 bit" should read --$I_2$ bit--.
Line 40, "$I_2$ bit" should read --$I_0$ bit--.
Line 41, "13 bit" should read --$I_3$ bit--.

COLUMN 11

Line 10, "sad" should read --said--.
Line 20, "shifting" should read --said shifting--.

COLUMN 12

Line 13, "said means" should read --said input means--.
Line 27, "b" should read --by--.
Line 48, "determining step" should read --a determining step--.

Signed and Sealed this

Thirtieth Day of May, 1995

Attest:

BRUCE LEHMAN

Attesting Officer     Commissioner of Patents and Trademarks